(12) United States Patent
Zhang et al.

(10) Patent No.: US 10,552,723 B2
(45) Date of Patent: Feb. 4, 2020

(54) OSCILLATION MAINTENANCE CIRCUIT WITH TRIGGER-BASED PULSE GENERATION IN HALF-DUPLEX RFID TRANSPONDERS

(71) Applicants: EXCELIO TECHNOLOGY (SHENZHEN) CO., LTD., Shenzhen (CN); WUXI EXCELIO TECHNOLOGY CO., LTD., Wuxi (CN)

(72) Inventors: Qianwen Zhang, Shenzhen (CN); Patrick Bian Wu, Shenzhen (CN); Fuqiang Han, Shenzhen (CN)

(73) Assignee: EXCELIO TECHNOLOGY (SHENZHEN) CO., LTD., Shenzhen (CN)

( * ) Notice: Subject to any disclaimer, the term of this patent is extended or adjusted under 35 U.S.C. 154(b) by 0 days.

(21) Appl. No.: 16/340,932

(22) PCT Filed: Oct. 10, 2017

(86) PCT No.: PCT/CN2017/105531
§ 371 (c)(1),
(2) Date: Apr. 10, 2019

(87) PCT Pub. No.: WO2018/068699
PCT Pub. Date: Apr. 19, 2018

(65) Prior Publication Data
US 2019/0286966 A1    Sep. 19, 2019

(30) Foreign Application Priority Data
Oct. 11, 2016    (CN) .......................... 2016 1 0890170

(51) Int. Cl.
G06K 19/077    (2006.01)
G06K 19/07    (2006.01)
H03B 5/12    (2006.01)

(52) U.S. Cl.
CPC ... G06K 19/07773 (2013.01); G06K 19/0723 (2013.01); H03B 5/1228 (2013.01)

(58) Field of Classification Search
CPC ..................... G06K 19/07773; G06K 19/0723
(Continued)

(56) References Cited

U.S. PATENT DOCUMENTS 6,806,738 B2    10/2004    Kokubo et al.
7,667,548 B2    2/2010    Meier
(Continued)

FOREIGN PATENT DOCUMENTS

CN    102355196 A    2/2012
CN    103679259 A    3/2014
(Continued)

OTHER PUBLICATIONS

The World Intellectual Property Organization (WIPO) International Search Report for PCT/CN2017/105531 dated Jan. 17, 2018 8 Pages (including translation).

*Primary Examiner* — Allyson N Trail
(74) *Attorney, Agent, or Firm* — Anova Law Group, PLLC

(57) ABSTRACT

A half-duplex RFID oscillation maintenance circuit with trigger-based pulse generation is provided, including: a resonance inductor and a resonance capacitor forming an L-C resonance circuit coupled to an external radio frequency field to generate alternating current for a rectifier circuit, which is connected to an energy-storage capacitor. A first antenna end is connected to a trigger circuit through a switch unit and a resistor connected in series; and an output end of
(Continued)

the trigger circuit is connected to a control end of the switch unit. The trigger circuit is configured to sample an oscillation signal at the first antenna end to generate a rectangular wave signal, whose pulse width can be self-adaptively adjusted, to control OFF/ON of the switch unit and, when the switch unit is ON, to form a current injection loop from the energy-storage capacitor to the L-C resonance circuit.

6 Claims, 8 Drawing Sheets

(58) Field of Classification Search
USPC .......................................... 235/492; 340/10.1
See application file for complete search history.

(56) References Cited

U.S. PATENT DOCUMENTS

| 8,629,759 | B2 | 1/2014 | Muellner | |
|---|---|---|---|---|
| 2009/0033411 | A1* | 2/2009 | Meier | G06K 19/0723 |
| | | | | 327/596 |
| 2013/0186959 | A1* | 7/2013 | Smith | G06K 19/0715 |
| | | | | 235/492 |
| 2014/0049378 | A1* | 2/2014 | Randjelovic | G06K 19/0701 |
| | | | | 340/10.1 |
| 2014/0354413 | A1* | 12/2014 | Sirinamarattana | ............................ |
| | | | | G06K 19/0713 |
| | | | | 340/10.3 |
| 2016/0034728 | A1* | 2/2016 | Oliver | G06K 7/10257 |
| | | | | 340/10.1 |
| 2017/0243032 | A1* | 8/2017 | Pesavento | G06K 7/10297 |
| 2019/0236426 | A1* | 8/2019 | Zhang | G06K 19/0723 |

FOREIGN PATENT DOCUMENTS

| CN | 104038046 A | 9/2014 |
|---|---|---|
| CN | 106650876 A | 5/2017 |

* cited by examiner

OSCILLATION MAINTENANCE CIRCUIT WITH TRIGGER-BASED PULSE GENERATION IN HALF-DUPLEX RFID TRANSPONDERS

CROSS-REFERENCE TO RELATED APPLICATIONS

This application is a national stage entry of PCT Patent Application No. PCT/CN2017/105531, filed on Oct. 10, 2017, which claims priority to Chinese Patent Application No. 201610890170.0, filed on Oct. 11, 2016, contents of all of which are incorporated herein by reference in entirety.

FIELD

The present invention relates to the field of passive radio frequency identification (RFID) and, more specifically, to a half-duplex RFID oscillation maintenance circuit with trigger-based pulse generation, and a half-duplex passive RFID transponder including the oscillation maintenance circuit.

BACKGROUND

Half-duplex (HDX) radio frequency communication is a way of communication for a passive RFID transponder. In the communication process, information can be transmitted by an RFID reader to the transponder, referred to as downlink transmission, or by the transponder to the reader, referred to as uplink transmission. The HDX transmission is such a transmission mode in which uplink transmission and downlink transmission are not simultaneously performed. During a downlink transmission, the reader transmits radio frequency (RF) field energy, and a passive transponder receives the RF field energy with an L-C resonance circuit formed by a resonance inductor L (also called antenna) and a resonance capacitor C; a rectifier circuit in the transponder converts an alternating current into a direct current to be used by internal circuitries of the transponder, and stores electrical energy obtained through rectification in a storage capacitor $C_L$. Mostly, amplitude modulation (AM) is adopted as a modulation scheme for the information delivered by the reader to the transponder, that is, RF oscillation current signals with different amplitudes are used to represent the code "0" or "1" in digital transmission. The RF signal in the downlink transmission may include operational instructions, such as writing an identification (ID) code into the memory of the transponder. In such operation, the transponder first receives the RF signal, and then performs a demodulation operation, and finally carries out the operation of writing the ID code into the memory. The transponder responds to the reader with an uplink transmission. During the uplink transmission, the reader stops transmitting RF field energy, a state referred to as field-off; and the transponder is powered by the electrical energy stored in an energy-storage capacitor, that is, the transponder transmits its response to the reader through the antenna. In some international standard RFID communications protocols, such as the ISO 11784/11785 standard for animal identification, transponder's response may be modulated using a frequency shift keying (FSK) scheme, where code "0" and code "1" in information may be respectively represented by different signal frequencies.

A key performance requirement of RFID applications is the distance of communication, i.e., communication with high sensitivity. As far as the HDX communication is concerned, the key is to maintain oscillation of the L-C resonance circuit at the antenna end during the period when RF field is switched off. Provided that oscillation magnitude is sufficient as required by a reader's receiving sensitivity, the oscillation frequency of the L-C resonance circuit is determined by the data "0" and "1" being sent; the oscillation has to be maintained until the uplink of data is completed. In this communication mode, energy stored in the storage capacitor is mainly consumed by the oscillation maintenance circuit, while other circuit modules are in a sleep state, consuming very little electrical energy. Apparently, the design quality of oscillation maintenance circuit is one of the key techniques for passive HDX RFID transponders. An oscillation maintenance circuit that charges an L-C resonance circuit through an energy-storage capacitor instead of an external power supply significantly influences communication distance of the transponder.

FIG. 1 is a block diagram of a communication process of an HDX passive RFID transponder. The oscillation maintenance circuit shown in the figure is one of the key elements. The application is an improvement on this circuit.

An existing solution for the oscillation maintenance circuit is disclosed in U.S. Pat. No. 6,806,738 by Texas Instruments, which proposed a complex peak detection circuit to monitor peak value of the alternating current oscillation magnitude when RF field is off. When the detected peak of alternating current oscillation magnitude is lower than a pre-determined threshold, an oscillation maintenance circuit controls related circuitry to inject electrical charges stored in a storage capacitor into the L-C resonance circuit, so that the resonance circuit continues to oscillate while maintaining a certain level of oscillating amplitude. As shown in FIG. 2, a current pulse is generated just at the point of time when the peak value of an RF signal is lower than the pre-determined threshold. This method is referred to as "plucking (fast injection)".

An advantage of the fast injection is that the oscillation maintenance circuit has very high efficiency. When the resonance circuit requires energy, the oscillation maintenance circuit injects a current into the resonance inductor, and maintains oscillation with high-energy current pulses. However, it has the following two disadvantages:

First, the signal processing process is complicated, which results in a complicated circuit structure whose implementation requires a lot of analog circuitries. Those analog circuitries themselves consume a lot of energy in the energy-storage capacitor, which in turn limits the usage of the fast injection method.

Second, the frequency of the injected current pulses is determined by the decaying characteristic of the oscillation magnitude of the resonance circuit, and is significantly different from the resonance frequency of the resonance circuit without correlation. Therefore, during uplink, there is a frequency shift on the oscillating signals at the antenna end, causing difficulty for the reader to receive and demodulate uplinked signals.

Another existing solution of the oscillation maintenance circuit is disclosed in U.S. Pat. No. 7,667,548 by Texas Instruments, which employed an end-of-burst (EOB) detection circuit. When an end of burst of a reader is detected, the EOB detection circuit generates an enable signal that in turn controls the oscillation maintenance circuit to continue to operate. In this solution, the oscillation maintenance circuit comprises a clock generation circuit, a programmable memory, an AND gate circuit, a current-limiting resistor, and a switch, etc. The clock generation circuit extracts a clock signal out of the RF field signal, and a combinational logic operation is performed between the clock signal and the "0" and "1" bit stream of the data being transmitted. In such a way, a current injection switch is turned on and off, and a current is smoothly injected into an L-C resonant circuit. Further, the current injection occurs in a negative half-period of the RF signal, and the injected current is a varying current without a fixed value. The injected current is limited by the current-limiting resistor R, and is related to an intrinsic quality factor of the resonance circuit, and therefore needs to be designed and controlled carefully. Further, a plurality of branches comprising of series connected current-limiting resistor R and current injection switch can be used to calibrate the resistance deviations due to manufacturing process deviations.

Advantages of this method are that the current can be smoothly injected, without causing a frequency drift of the RF response signal generated by the resonance circuit, and that circuit structure is simpler than that of the first solution and is easy to implement. However, there are disadvantages as follows:

First, the efficiency is low. Current injection occurs in the entire negative half-period of the RF signal, and takes a longer time than with current pulses, and therefore current consumption is high.

Second, the amount of the injected current in this method is closely related to quality factor of the resonance circuit. Therefore, the current-limiting resistor R needs to be designed carefully. The circuit uses a plurality of current injection branches controlled by switches, and it is a complicated process to select and control a current injection branch.

A third existing solution is disclosed in U.S. Pat. No. 8,629,759 by Texas Instruments. In this solution, modifications are made based on the previous two solutions. Firstly, regarding the problem of frequency drift in the first solution, a phase-locked loop (PLL) consisted of a loop filter, a phase and frequency detector, a voltage-controlled oscillator, and a multiplexer is adopted to stabilize the signal frequency. Secondly, to address the issue of efficiency in the second solution, a pulse width control method is proposed (that is, current is injected into resonance circuit in every half period, and a duration of current injection may be controlled accordingly). With the combination of the two modifications, a method to generate an injection control pulse signal of a stable frequency and a controllable pulse width to control the "plucking" current can be obtained. This solution works well and resolves the current injection efficiency problem and the frequency drift problem.

However, the third solution does not provide a method to control the pulse width. In addition, a PLL circuit for stabilizing control signal's frequency causes even larger power consumption of the transponder. Thus, the overall performance of the transponder is decreased.

SUMMARY

To improve the efficiency of oscillation maintenance circuits of HDX passive RFID transponders, the present disclosure provides a high efficiency, low power consumption, and easy-to-implement oscillation maintenance circuit with adjustable pulse injection time duration. The disclosed circuit has a certain degree of self-adaptability and features simple structure, low power consumption, and relatively high efficiency, and prevents the problem of frequency drift of the oscillating signal at the antenna end of HDX passive RFID transponders caused by current injection of oscillation maintenance circuits.

To achieve the foregoing objectives, the present disclosure provides a half-duplex RFID oscillation maintenance circuit with trigger-based pulse generation, including: a resonance inductor and a resonance capacitor connected in parallel between a first antenna end and a second antenna end. The resonance inductor and the resonance capacitor form an L-C resonance circuit that is coupled to an external radio frequency field to generate alternating current and inputs the alternating current to a rectifier circuit. An output end of the rectifier circuit is connected to an energy-storage capacitor and an internal circuit; the first antenna end is connected to a trigger circuit, as an input end; a power input end of the trigger circuit is connected to the first antenna end through a switch unit and a resistor connected in series; and an output end of the trigger circuit is connected to a control end of the switch unit. The trigger circuit is configured to sample an oscillation signal at the first antenna end to generate a rectangular wave signal, whose pulse width can be self-adaptively adjusted, to control OFF/ON of the switch unit and, when the switch unit is ON, to form a current injection loop from the energy-storage capacitor to the L-C resonance circuit Further, the trigger circuit includes a Schmitt circuit formed by a fourth P-type MOS transistor, a fifth P-type MOS transistor, a sixth P-type MOS transistor, a fourth N-type MOS transistor, a fifth N-type MOS transistor, and a sixth N-type MOS transistor, a first inverter formed by a ninth P-type MOS transistor and a ninth N-type MOS transistor, and a second inverter formed by a tenth P-type MOS transistor and a tenth N-type MOS transistor. A source electrode of the fourth P-type MOS transistor is connected to a first threshold unit and is used as an input end of the first threshold unit; an output end of the first threshold unit is connected to a drain electrode of the sixth N-type MOS transistor; a drain electrode of the sixth P-type MOS transistor is connected to a second threshold unit and is used as an input end of the second threshold unit; and an output end of the second threshold unit is grounded.

Advantages of the present disclosure using the foregoing structure include followings:

First, the Schmitt trigger circuit used by the present invention is equivalent to a pulse generator, and its operating principle is as follows: the Schmitt trigger generates a rectangular wave signal by sampling an oscillation voltage signal at the first antenna end; the rectangular wave signal controls OFF/ON of the switch unit; and when the switch unit is ON, a current injection loop is formed; therefore, the storage capacitor $C_L$ injects charges into the L-C resonance circuit thus maintaining oscillations. The present disclosure improves current injection efficiency of the oscillation maintenance circuit, reduces power consumption, and increases communication distance of HDX passive RFID transponders.

Second, in the present disclosure, instead of complex circuit structures such as phase-locked loop and end-of-burst detection circuit, a Schmitt trigger with much simpler structure is used that precisely controls the charging switch signal. In addition, a Schmitt trigger may be adjusted to generate rectangular pulses with adaptive widths according to the relationship between rectifier's output voltage value of vdda and amplitude of sampled RF oscillation signal, which is equivalent to adjust current injection time duration. The Schmitt trigger has advantages of a simple structure, low power consumption, and easy implementation.

Third, a current injection circuit in the present invention is formed by the switch component and the L-C resonant circuit that are connected in series, which makes a switch signal frequency the same as RF signal frequency. Therefore, the current injection mechanism has no impact on oscillation frequency of the resonance circuit.

DETAILED DESCRIPTION

The following describes the technical solutions in the embodiments of the present disclosure with reference to the accompanying drawings. Apparently, the described embodiments are merely some but not all of the embodiments of the present disclosure. Other embodiments obtained by a person of ordinary skill in the art based on the embodiments of the present disclosure without creative efforts shall fall within the protection scope of the present disclosure.

Figure 1:
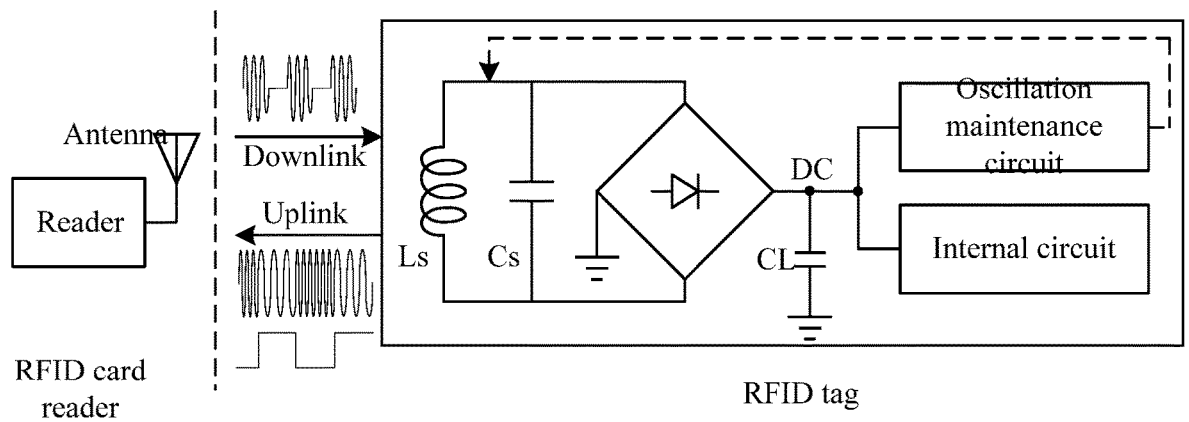
FIG. 1 is a block diagram of an HDX communication process between a reader and an HDX passive RFID transponder.
Figure 2:
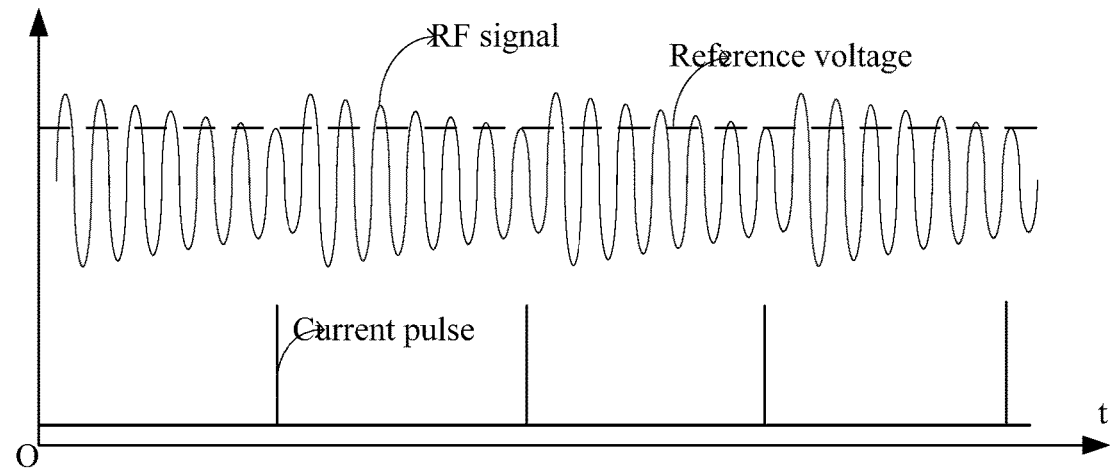
FIG. 2 is an illustration of signal waveforms of current injection of the oscillation maintenance circuit.
Figure 3:
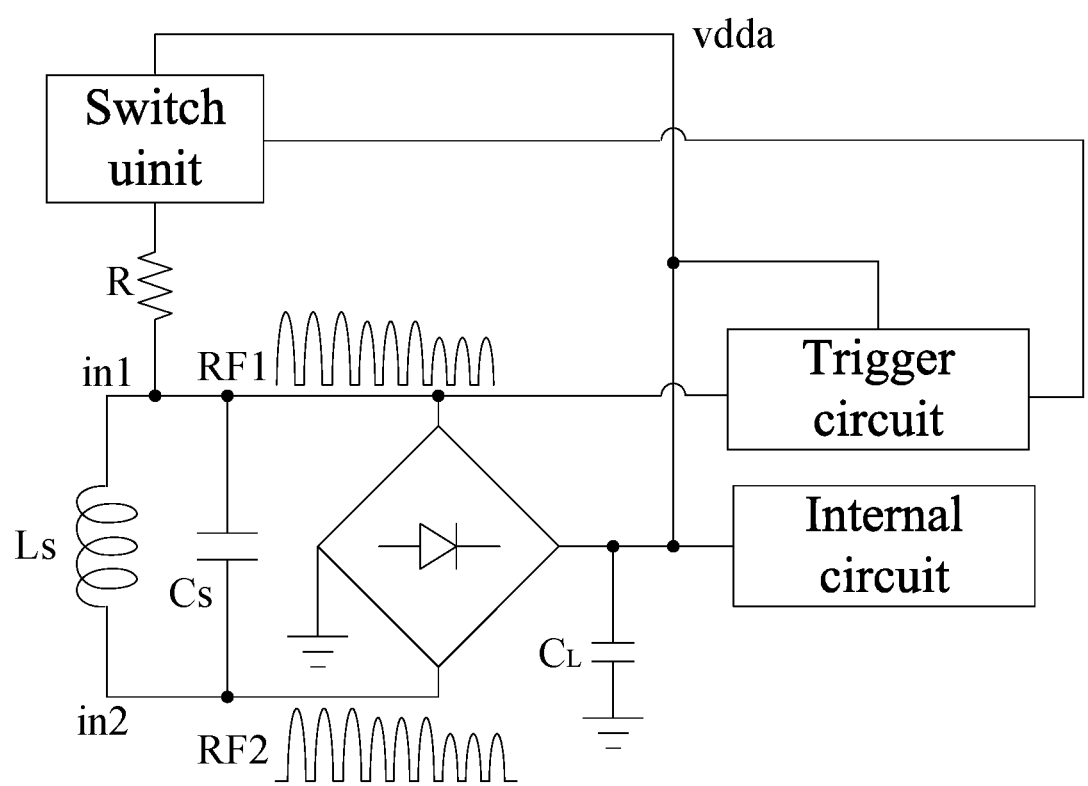
FIG. 3 is a schematic diagram of an oscillation maintenance circuit system of the present disclosure.

FIG. 3 is a schematic diagram of an oscillation maintenance circuit within an HDX passive RFID transponder according to the present disclosure. The present disclosure provides a half-duplex RFID oscillation maintenance circuit with trigger-based pulse generation to control current injection of a resonance circuit. As shown in FIG. 3, the circuit includes a resonance inductor, Ls, and a resonance capacitor, Cs, that are connected in parallel between a first antenna end, in1, and a second antenna end, in2. The resonance inductor and the resonance capacitor are configured to form an L-C resonance circuit, so that the L-C resonance circuit can receive external electromagnetic field and provide input to a rectifier circuit. An output end of the rectifier circuit is connected to an energy-storage capacitor, $C_L$, and internal circuitry. The first antenna end, in1, is connected to an input end of a trigger circuit. A power end, vdda, of the trigger circuit is connected to the first antenna end, in1, through a switch unit and a resistor, R, that are connected in series, and an output end of the trigger circuit is connected to a control end of the switch unit. The trigger circuit is configured to sample the oscillation voltage at the first antenna end (when the electromagnetic field is off) to generate a rectangular wave signal whose pulse width can be self-adaptively adjusted, which is used to control OFF/ON of the switch unit. When the switch unit is ON, a charging current loop from the storage capacitor, $C_L$, to the L-C resonance circuit is formed.

A Schmitt trigger in the present disclosure is equivalent to a hysteresis comparator. The Schmitt trigger generates a rectangular wave signal by sampling the oscillation voltage at the first antenna end; the rectangular wave signal controls OFF/ON of the switch unit. When the switch unit is ON, a current injection loop through vdda→switch unit→R→L-C resonance circuit is formed; the energy-storage capacitor, $C_L$, injects current/charges into the L-C resonance circuit, so as to prevent the resonance circuit's oscillation amplitude from decreasing after the field is off, thus achieving the maintenance of the circuit oscillation. Thus, the present disclosure improves current injection efficiency of the oscillation maintenance circuit, reduces power consumption, therefore improves the transponder's energy utilization, and increases communication distance of the HDX passive RFID transponder.

The switch unit in the present disclosure is configured to control ON/OFF of the current injection loop, so as to control the current injection and injection time. The switch unit may be a switch device, a compound switch, or a switch-type component, and the ON/OFF of the switch unit may be controlled by the Schmitt trigger circuit.

Figure 4:
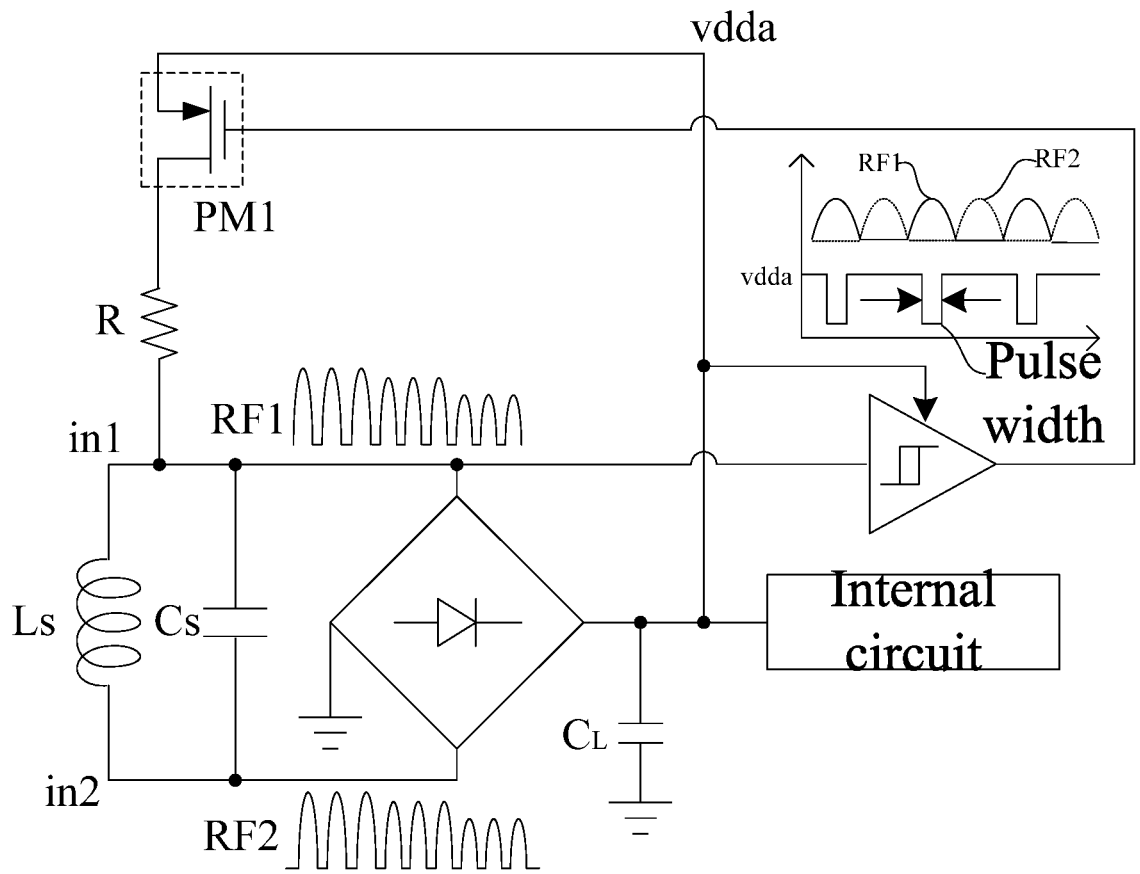
FIG. 4 is a structural diagram of an oscillation maintenance circuit with a switch unit according to an embodiment of the present disclosure.
Figure 5:
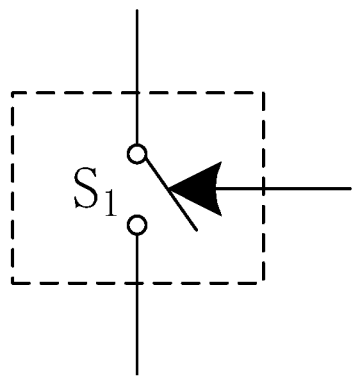
FIG. 5 is a structural diagram of a switch unit of an oscillation maintenance circuit according to another embodiment of the present disclosure.

In an embodiment of the present disclosure, shown in FIG. 4, the switch unit is a first switch S1 shown in FIG. 5, where an input end of the first switch S1 is connected to a resistor R and a power end of the first switch S1 is connected to a power supply vdda, and a control end of the first switch S1 is connected to the output end of the Schmitt trigger circuit.

The said switch unit may also be either a first P-type MOS transistor PM1 or a first compound switch.

In the embodiment shown in FIG. 4, the switch unit is the a P-type MOS transistor PM1, where a source electrode of the first P-type MOS transistor PM1 is connected to the power supply vdda, as a power end of the switch unit S1, and a drain electrode of the first P-type MOS transistor PM1 is connected to the resistor R, as the input of the switch unit S1, and a gate electrode of the first P-type MOS transistor PM1 is connected to the output end of the Schmitt trigger circuit as the control end of the switch unit.

Figure 6:
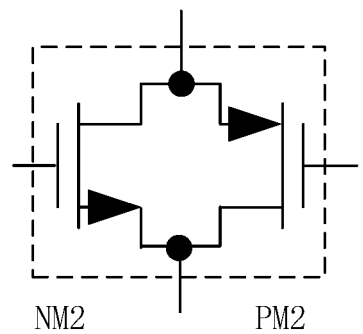
FIG. 6 is a structural diagram of a switch unit of an oscillation maintenance circuit according to another embodiment of the present disclosure.

In the embodiment shown in FIG. 6, the switch unit is a first compound switch. The first compound switch includes a second N-type MOS transistor NM2, a second P-type MOS transistor PM2 that are connected in parallel to PM1. The drain electrode of the second N-type MOS transistor NM2 is connected to the source electrode of the second P-type MOS transistor PM2, and is also connected to a power supply vdda, and is used as a power end of the first compound switch. The source electrode of the second N-type MOS transistor NM2 is connected to the drain electrode of the second P-type MOS transistor PM2, and is also connected to the resistor R, and is used as an input end of the first compound switch. The gate electrode of the second P-type MOS transistor PM2 is connected to the output end of the trigger circuit and is used as a first control end of the first compound switch. The gate electrode of the second N-type MOS transistor NM2 is connected to the output end of the trigger circuit and is used as a second control end of the first compound switch.

The trigger circuit is configured to sample the output signal RF1 at the first antenna end in1, and outputs a rectangular wave signal with controllable pulse width to the switch unit. The switch unit is turned ON or OFF under the control of the rectangular wave signal, so as to control current/charge injection into the L-C resonance circuit and the current injection time.

Figure 7:
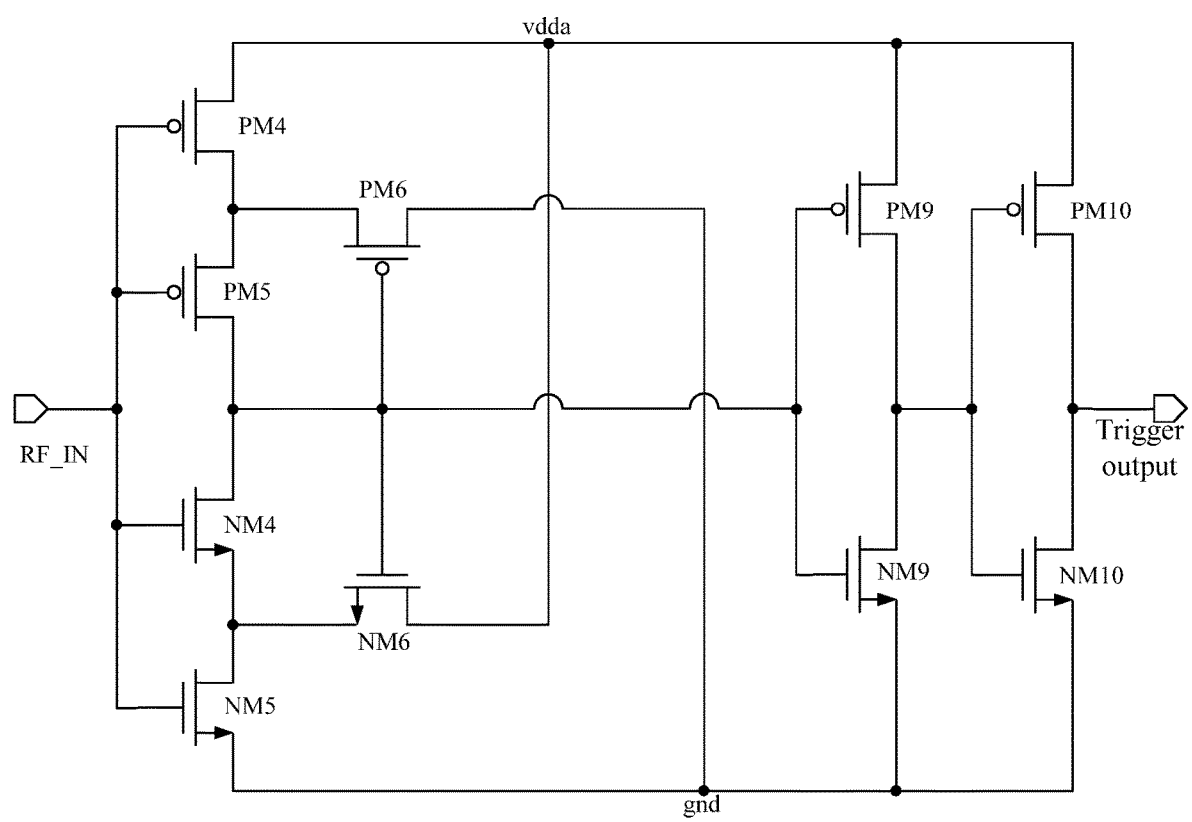
FIG. 7 is a structural diagram of a conventional Schmitt trigger circuit.
Figure 8:
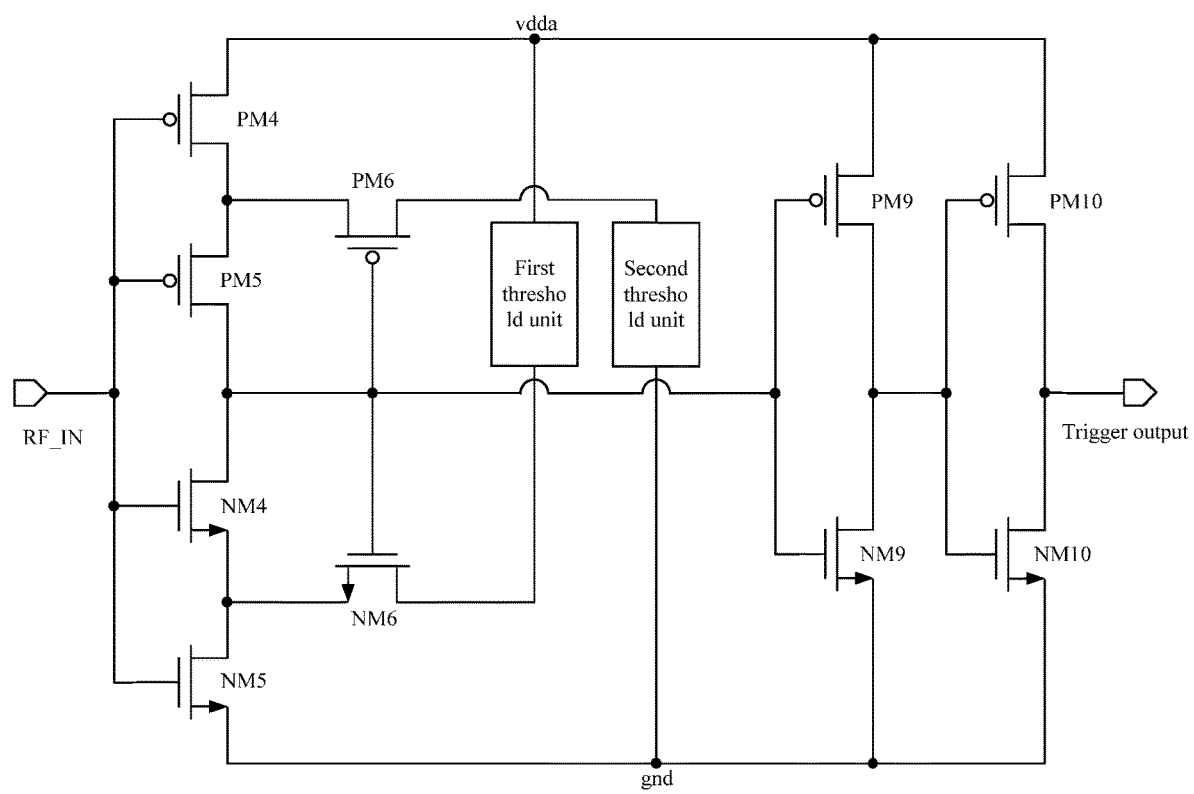
FIG. 8 is a structural diagram of a Schmitt trigger circuit according to an embodiment of the present disclosure.

As shown in FIG. 7, the trigger circuit includes a Schmitt circuit having a fourth P-type MOS transistor PM4, a fifth P-type MOS transistor PM5, a sixth P-type MOS transistor PM6, a fourth N-type MOS transistor NM4, a fifth N-type MOS transistor NM5, and a sixth N-type MOS transistor NM6, an inverter consisting a ninth P-type MOS transistor PM9, and a ninth N-type MOS transistor NM9, and an inverter including a tenth P-type MOS transistor PM10 and a tenth N-type MOS transistor NM10. Based on the Schmitt circuit, the trigger circuit in the present disclosure further includes a first threshold unit connected to the source electrode of the fourth P-type MOS transistor PM4, and the drain electrode of the sixth N-type MOS transistor NM6, and a second threshold unit connected between the drain electrode of the sixth P-type MOS transistor PM6 and ground, as shown in FIG. 8.

The first threshold unit includes at least one diode connected in series, or at least one P-type MOS transistor connected in series, or at least one N-type MOS transistor connected in series.

Within the at least one diode, the cathode of any diode is connected to an anode of an adjacent diode to form a serial structure; the anode of a first diode is connected to the source electrode of the fourth P-type MOS transistor and is used as the input end of the first threshold unit. The cathode of a last diode is connected to the drain electrode of the sixth N-type MOS transistor and is used as the output end of the first threshold unit.

Within the at least one P-type MOS transistor, the drain electrode of any P-type MOS transistor is connected to the source electrode of an adjacent P-type MOS transistor to form a serial structure. The source electrode of a first P-type MOS transistor is connected to the source electrode of the fourth P-type MOS transistor and is used as the input end of the first threshold unit. The drain electrode of a last P-type MOS transistor is connected to the drain electrode of the sixth N-type MOS transistor and is used as the output end of the first threshold unit. The gate electrode of each P-type MOS transistor is respectively connected to its own drain electrode.

Figure 9:
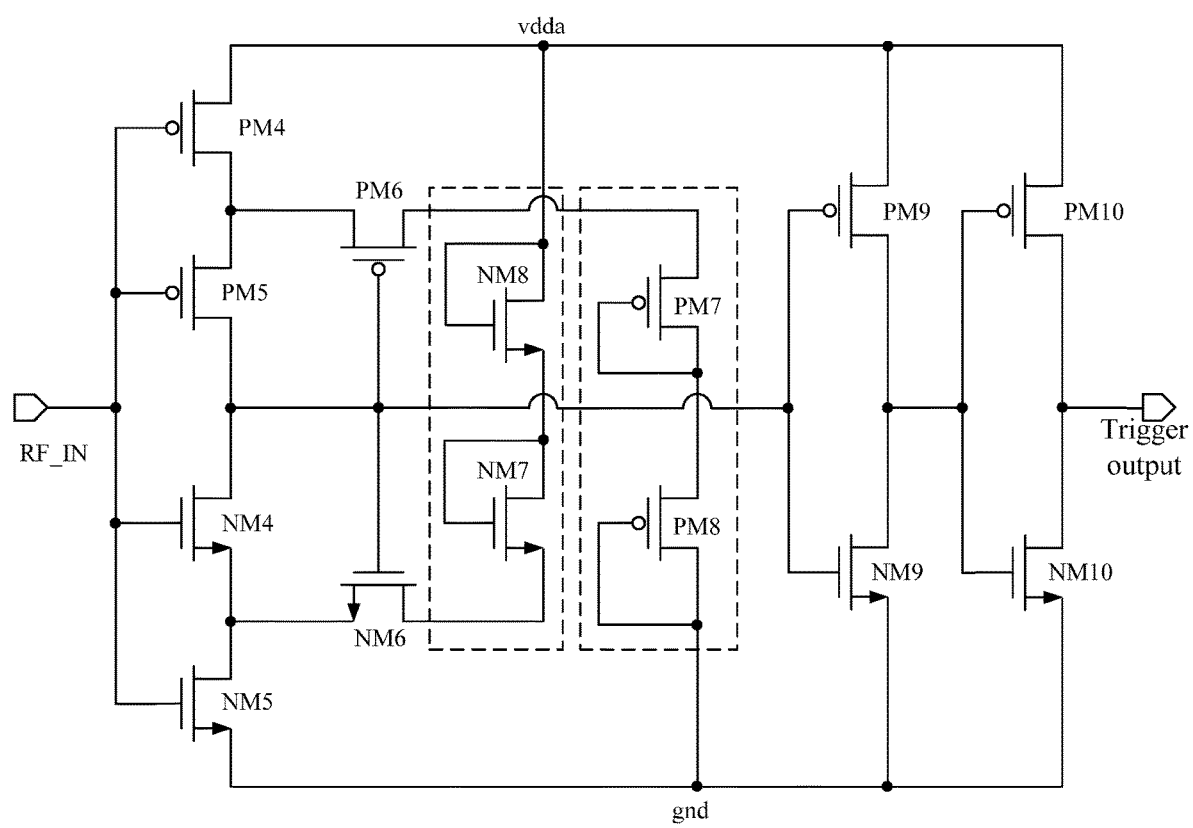
FIG. 9 is a structural diagram of a Schmitt trigger according to another embodiment of the present disclosure.

Within the at least one N-type MOS transistor, the source electrode of any N-type MOS transistor is connected to the drain electrode of an adjacent N-type MOS transistor to form a serial structure. The drain electrode of a first N-type MOS transistor is connected to the source electrode of the fourth P-type MOS transistor and is used as the input end of the first threshold unit. The source electrode of a last N-type MOS transistor is connected to the drain electrode of the sixth N-type MOS transistor and is used as the output end of the first threshold unit. The gate electrode of each N-type MOS transistor is respectively connected to its own drain electrode. In an embodiment of the present disclosure shown in FIG. 9, the first threshold unit is constructed as an example with two diode-connected N-type MOS transistors NM8 and NM7.

The second threshold unit is at least one diode connected in series, or at least one P-type MOS transistor connected in series, or at least one N-type MOS transistor connected in series.

Within the at least one diode, the cathode of any diode is connected to the anode of an adjacent diode to form a serial structure. The anode of a first diode is connected to the drain electrode of the sixth P-type MOS transistor and is used as the input end of the second threshold unit; and the cathode of a last diode is grounded and is used as the output end of the second threshold unit.

Within the at least one P-type MOS transistor, the drain electrode of any P-type MOS transistor is connected to the source electrode of an adjacent P-type MOS transistor to form a serial structure. The source electrode of a first P-type MOS transistor is connected to the drain electrode of the sixth P-type MOS transistor and is used as the input end of the second threshold unit. The drain electrode of a last P-type MOS transistor is grounded and is used as the output end of the second threshold unit; and the gate electrode of each P-type MOS transistor is respectively connected to its own drain electrode.

Within the at least one N-type MOS transistor, the source electrode of any N-type MOS transistor is connected to the drain electrode of an adjacent N-type MOS transistor to form a serial structure. The drain electrode of a first N-type MOS transistor is connected to the drain electrode of the sixth P-type MOS transistor and is used as the input end of the second threshold unit. The source electrode of a last N-type MOS transistor is grounded and is used as the output end of the second threshold unit; and the gate electrode of each N-type MOS transistor is respectively connected to its own drain electrode. In an embodiment of the present disclosure shown in FIG. 9, the second threshold unit is constructed as an example with two diode-connected P-type MOS transistors PM7 and PM8.

Compared with the conventional Schmitt trigger, the Schmitt trigger used in the present disclosure has added the first threshold unit and the second threshold unit. This structure has the advantage of reducing the current flowing through the path formed by the first threshold unit, the sixth N-type MOS transistor NM6, and the fifth N-type MOS transistor NM5, and also the current flowing through the path formed by the fourth P-type MOS transistor PM4, the sixth P-type MOS transistor PM6, and the second threshold unit, thus reducing overall power consumption of the circuit.

Based on theoretical circuitry analysis, the high and low trigger voltages of the Schmitt trigger can be calculated as follows (M. Filanovsky and H. Baltes, "CMOS Schmitt Trigger Design", IEEE Transactions on Circuits and Systems—Fundamental Theory and Applications, Vol. 41, No. 1, January 1994, pp 47, eq. [15]):

$$V_H = \frac{V_{dda} + S_{NM56}V_{TN}}{1 + S_{NM56}},$$

$$V_L = \frac{S_{PM46}(V_{dda} - |V_{TP}|)}{1 + S_{PM46}}. \text{ where}$$

$$S_{NM56} = \sqrt{\frac{(W/L)_{NM5}}{(W/L)_{NM6}}}, S_{PM46} = \sqrt{\frac{(W/L)_{PM4}}{(W/L)_{PM6}}}.$$

As can be seen, the high-trigger voltage $V_H$ and the low-trigger voltage $V_L$ have positive correlations with vdda, and are also related to the component parameters, such as the width-length ratios of the MOS transistors' channels.

Figure 10:
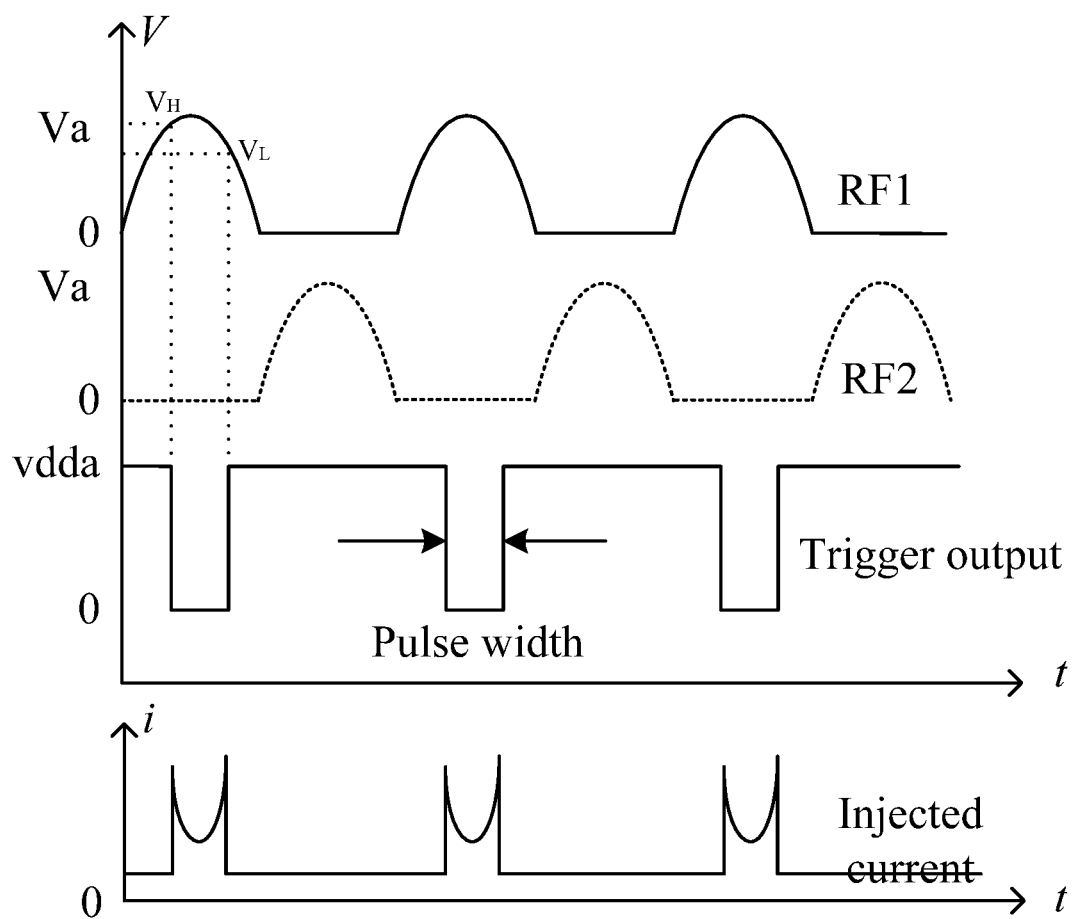
FIG. 10 is a signal waveform diagram of an oscillation maintenance circuit according to the present disclosure.

The operation principle of the present disclosure is as follows: the Schmitt trigger, equivalent to a pulse generator, samples the output signal voltage RF1 at the first antenna end in1, and generates a rectangular wave signal with self-adaptively adjustable pulse width, as shown in FIG. 10. When the output signal voltage of the trigger circuit is at low (zero-voltage) level, the switch unit is in the ON state. During this time period, the energy-storage capacitor $C_L$ injects current into the L-C resonance circuit. The waveform graph of the injected current is shown in FIG. 10. When the output signal voltage RF1 is at a peak value, the injected current is at minimum. Due to the hysteresis characteristic of the Schmitt trigger, the start and end time of the pulse are not symmetric with respect to the voltage peak point of RF1, making injected current asymmetric. When all component parameters of the Schmitt trigger are determined, the on/off time of the switch unit, which is also the pulse width outputted by the trigger circuit, adaptively changes with the decrease of the rectifier's output voltage vdda and the RF oscillation signal's magnitude. According to this self-adaptive adjustment mechanism, injected current for maintaining circuit oscillation after the RF field is off is accordingly adjusted with the voltage of the power vdda and the RF oscillation signal magnitude, thus improving efficiency of current injection.

As shown in FIG. 10, when the magnitude of the RF oscillation signal rises from 0 towards $V_H$, $V_{RF}<V_H$, the trigger circuit outputs a logic signal "1", and the switch unit is OFF, and the energy-storage capacitor $C_L$ is not injecting any energy into the L-C resonance circuit, that is, the injected current is 0. When $V_{RF}>V_H$ and $V_{RF}>V_L$, the trigger circuit flips and outputs a logic signal "0", which in turn makes the inverter output "1", and makes the switch unit in the OFF state, so the energy-storage capacitor $C_L$ injects energy into the L-C resonance circuit to maintain circuit oscillation. When $V_{RF}<V_L$, the trigger circuit flips again, which makes the switch unit OFF, and the energy-storage capacitor $C_L$ stops current injection. This process repeats periodically.

Figure 11:
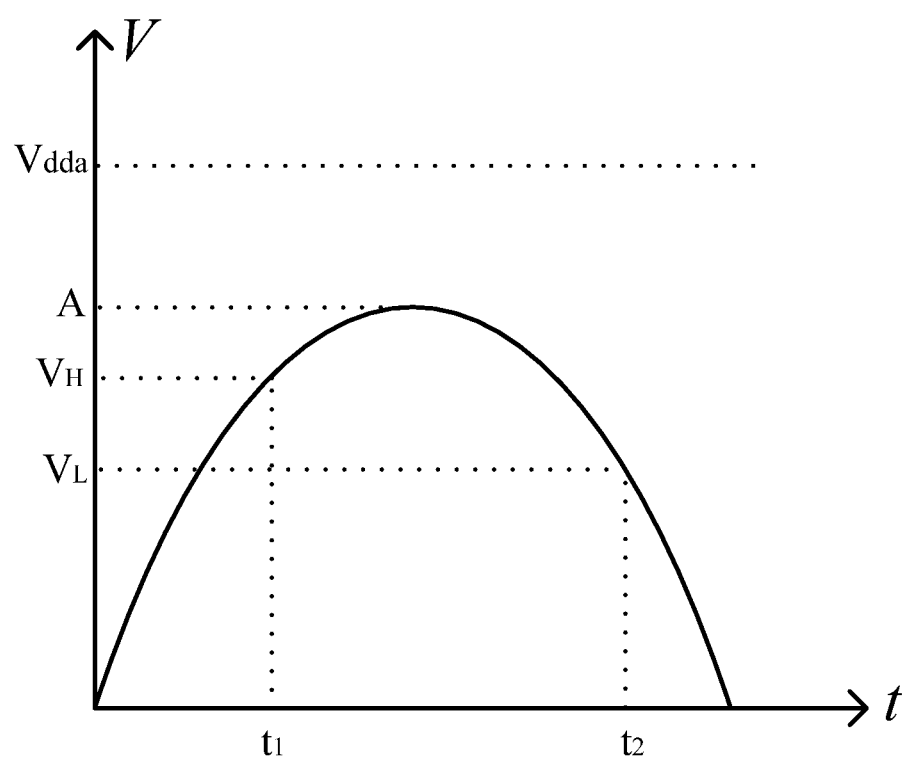
FIG. 11 is a diagram of a correspondence between flipping of a trigger circuit and time according to the present disclosure.

The principle of the foregoing self-adaptive pulse width control is as follows. As shown in FIG. 11, assuming that the voltage waveform of the RF in an RF period is:

$$V_{RF}(t) = A \cdot \sin(2\pi f t), t \in \left(0, \frac{1}{2f}\right)$$

where, A is the RF signal oscillation magnitude, provided that flipping points of the trigger circuit occur at $V_H$ and $V_L$, and $V_H$ and $V_L$ respectively are the high and low flipping voltages, as previously described, thus, $$\begin{cases} A \cdot \sin(2\pi f t) = V_H \\ A \cdot \sin(2\pi f t) = V_L \end{cases}$$

It may be followed that $$t_1 = \frac{\sin^{-1} \frac{V_H}{A}}{2\pi f}$$

$$t_2 = \frac{\sin^{-1} \frac{V_L}{A}}{2\pi f}$$

Therefore, the switch-on time duration, i.e., the pulse width $\Delta t$, is:

$$\Delta t = t_2 - t_1 = \frac{\pi - \left(\sin^{-1} \frac{V_H}{A} + \sin^{-1} \frac{V_L}{A}\right)}{2\pi f} \quad (1)$$

When the magnitude A of the RF decreases, first, from Ohm's law, the injected average current is $$\Delta I = \frac{V_{dda} - V_{RF}}{R},$$

which may become higher, where $V_{RF}$ is the average voltage value of the RF oscillation signal during the switch-on time duration.

If the oscillation signal magnitude A decreases, the values of $$\sin^{-1} \frac{V_H}{A} \text{ and } \sin^{-1} \frac{V_L}{A}$$

increase. According to (1), $\Delta t$ becomes smaller, that is, the pulse width, equivalently, the current injection duration time, becomes smaller; conversely, if the oscillation signal magnitude A increases, $\Delta I$ decreases, and $\Delta t$ becomes larger. It is apparent that the current injection pulse width self-adaptively changes according to the change of the magnitude of the RF oscillation signal, and an appropriate amount of charge is injected to maintain the magnitude of the RF oscillation signal of the resonance circuit. This adjustment mechanism is referred to as self-adaptive pulse control. According to this self-adaptive adjustment mechanism, energy for maintaining circuit oscillations after the RF field being off is accordingly adjusted with the change of the power and the magnitude of the RF signal. As a result, efficiency of current injection is improved, and overall power consumption is reduced. Therefore, HDX passive transponder's energy utilization rate is improved, and the communication distance of the RFID transponder is improved.

What is claimed is:

1. A half-duplex RFID oscillation maintenance circuit with trigger-based pulse generation, comprising:
    a resonance inductor and a resonance capacitor connected in parallel between a first antenna end and a second antenna end, wherein the resonance inductor and the resonance capacitor form an L-C resonance circuit that is coupled to an external radio frequency field to generate alternating current and inputs the alternating current to a rectifier circuit;
    wherein an output end of the rectifier circuit is connected to an energy-storage capacitor and an internal circuit;
    wherein the first antenna end is connected to a trigger circuit, as an input end; a power input end of the trigger circuit is connected to the first antenna end through a switch unit and a resistor connected in series; and an output end of the trigger circuit is connected to a control end of the switch unit; and
    wherein the trigger circuit is configured to sample an oscillation signal at the first antenna end to generate a rectangular wave signal, whose pulse width can be self-adaptively adjusted, to control OFF/ON of the switch unit and, when the switch unit is ON, to form a current injection loop from the energy-storage capacitor to the L-C resonance circuit.

2. The oscillation maintenance circuit according to claim 1, wherein:
    the switch unit is a first switch;
    an input end of the first switch is connected to the resistor;

a power end of the first switch is connected to a power supply; and a control end of the first switch is connected to the output end of the trigger circuit.

3. The oscillation maintenance circuit according to claim 1, wherein:

the switch unit is a first P-type MOS transistor or a first compound switch; and when the switch unit is the first P-type MOS transistor, a source electrode of the first P-type MOS transistor is connected to a power supply and is used as a power end of the switch unit; a drain electrode of the first P-type MOS transistor is connected to the resistor and is used as an input end of the switch unit; and a gate electrode of the first P-type MOS transistor is connected to the output end of the trigger circuit and is used as a control end of the switch unit; and when the switch unit is the first compound switch, the first compound switch comprises a second N-type MOS transistor and a second P-type MOS transistor connected in parallel; a drain electrode of the second N-type MOS transistor is connected to a source electrode of the second P-type MOS transistor, and is also connected to a power supply and is used as a power end of the first compound switch; a source electrode of the second N-type MOS transistor is connected to a drain electrode of the second P-type MOS transistor, and is also connected to the resistor and is used as an input end of the first compound switch; a gate electrode of the second P-type MOS transistor is connected to the output end of the trigger circuit and is used as a first control end of the first compound switch; and a gate electrode of the second N-type MOS transistor is connected to the output end of the trigger circuit and is used as a second control end of the first compound switch.

4. The oscillation maintenance circuit according to claim 1, wherein:

the trigger circuit comprises a Schmitt circuit formed by a fourth P-type MOS transistor, a fifth P-type MOS transistor, a sixth P-type MOS transistor, a fourth N-type MOS transistor, a fifth N-type MOS transistor, and a sixth N-type MOS transistor, a first inverter formed by a ninth P-type MOS transistor and a ninth N-type MOS transistor, and a second inverter formed by a tenth P-type MOS transistor and a tenth N-type MOS transistor;

a source electrode of the fourth P-type MOS transistor is connected to a first threshold unit and is used as an input end of the first threshold unit;

an output end of the first threshold unit is connected to a drain electrode of the sixth N-type MOS transistor;

a drain electrode of the sixth P-type MOS transistor is connected to a second threshold unit and is used as an input end of the second threshold unit; and an output end of the second threshold unit is grounded.

5. The oscillation maintenance circuit according to claim 4, wherein:

the first threshold unit includes at least one diode connected in series, at least one P-type MOS transistor connected in series, or at least one N-type MOS transistor connected in series;

within the at least one diode, a cathode of any diode is connected to an anode of an adjacent diode to form a serial structure; an anode of a first diode is connected to the source electrode of the fourth P-type MOS transistor and is used as the input end of the first threshold unit; a cathode of a last diode is connected to the drain electrode of the sixth N-type MOS transistor and is used as the output end of the first threshold unit;

within the at least one P-type MOS transistor, a drain electrode of any P-type MOS transistor is connected to a source electrode of an adjacent P-type MOS transistor to form a serial structure; a source electrode of a first P-type MOS transistor is connected to the source electrode of the fourth P-type MOS transistor and is used as the input end of the first threshold unit; a drain electrode of a last P-type MOS transistor is connected to the drain electrode of the sixth N-type MOS transistor and is used as the output end of the first threshold unit; a gate electrode of each P-type MOS transistor is respectively connected to its own drain electrode; and within the at least one N-type MOS transistor, a source electrode of any N-type MOS transistor is connected to a drain electrode of an adjacent N-type MOS transistor to form a serial structure; a drain electrode of a first N-type MOS transistor is connected to the source electrode of the fourth P-type MOS transistor and is used as the input end of the first threshold unit; a source electrode of a last N-type MOS transistor is connected to the drain electrode of the sixth N-type MOS transistor and is used as the output end of the first threshold unit; a gate electrode of each N-type MOS transistor is respectively connected to its own drain electrode.

6. The oscillation maintenance circuit according to claim 4, wherein:

the second threshold unit includes at least one diode connected in series, at least one P-type MOS transistor connected in series, or at least one N-type MOS transistor connected in series;

within the at least one diode, a cathode of any diode is connected to an anode of an adjacent diode to form a serial structure; an anode of a first diode is connected to the drain electrode of the sixth P-type MOS transistor and is used as the input end of the second threshold unit; a cathode of a last diode is grounded and is used as the output end of the second threshold unit;

within the at least one P-type MOS transistor, a drain electrode of any P-type MOS transistor is connected to a source electrode of an adjacent P-type MOS transistor to form a serial structure; a source electrode of a first P-type MOS transistor is connected to the drain electrode of the sixth P-type MOS transistor and is used as the input end of the second threshold unit; a drain electrode of a last P-type MOS transistor is grounded and is used as the output end of the second threshold unit; a gate electrode of each P-type MOS transistor is respectively connected to its own drain electrode; and within the at least one N-type MOS transistor, a source electrode of any N-type MOS transistor is connected to a drain electrode of an adjacent N-type MOS transistor to form a serial structure; a drain electrode of a first N-type MOS transistor is connected to the drain electrode of the sixth P-type MOS transistor and is used as the input end of the second threshold unit; a source electrode of a last N-type MOS transistor is grounded and is used as the output end of the second threshold unit; a gate electrode of each N-type MOS transistor is respectively connected to its own drain electrode.

* * * * *